United States Patent
Naganuma (10) Patent No.: US 12,010,448 B2
(45) Date of Patent: Jun. 11, 2024

(54) SENSOR MODULE, ELECTRONIC DEVICE, SUBJECT DETECTION METHOD, AND PROGRAM

(71) Applicant: Sony Interactive Entertainment Inc., Tokyo (JP)

(72) Inventor: Hiromasa Naganuma, Tokyo (JP)

(73) Assignee: Sony Interactive Entertainment Inc., Tokyo (JP)

(*) Notice: Subject to any disclaimer, the term of this patent is extended or adjusted under 35 U.S.C. 154(b) by 486 days.

(21) Appl. No.: 17/277,487

(22) PCT Filed: Sep. 27, 2019

(86) PCT No.: PCT/JP2019/038114
§ 371 (c)(1),
(2) Date: Mar. 18, 2021

(87) PCT Pub. No.: WO2020/071266
PCT Pub. Date: Apr. 9, 2020

(65) Prior Publication Data
US 2021/0360181 A1 Nov. 18, 2021

(30) Foreign Application Priority Data
Oct. 4, 2018 (JP) .................................. 2018-188934

(51) Int. Cl.
*H04N 25/76* (2023.01)
*G01J 1/44* (2006.01)
*H01L 27/146* (2006.01)

(52) U.S. Cl.
CPC .............. *H04N 25/76* (2023.01); *G01J 1/44* (2013.01); *H01L 27/14605* (2013.01)

(58) Field of Classification Search
CPC ........ H04N 25/76; H04N 25/00; H04N 23/73; H04N 23/71; H01L 27/14605; G01J 1/44
USPC ....................................................... 348/294
See application file for complete search history.

(56) References Cited

U.S. PATENT DOCUMENTS

| 4,888,609 | A | * | 12/1989 | Hamada | ............ | G02B 7/36 |
| | | | | | | 396/104 |
| 5,550,363 | A | | 8/1996 | Obata | | |
| 5,625,413 | A | | 4/1997 | Katoh | | |
| 6,642,960 | B1 | | 11/2003 | Kohashi | | |

(Continued)

FOREIGN PATENT DOCUMENTS

| CN | 102192791 A | 9/2011 |
| JP | 06309485 A | 11/1994 |

(Continued)

OTHER PUBLICATIONS

Decision to Grant a Patent for related JP Application No. 2018-188936, 4 pages, dated Dec. 28, 2021.

(Continued)

*Primary Examiner* — Pritham D Prabhakher
(74) *Attorney, Agent, or Firm* — Matthew B. Dernier, Esq.

(57) ABSTRACT

Provided are a sensor module including an event-driven vision sensor that includes a sensor array having a sensor that generates an event signal when the sensor detects a change in intensity of incident light, and an actuator connected to the sensor array and configured to displace the sensor array in a predetermined direction, and an electronic device having such a sensor module.

7 Claims, 8 Drawing Sheets

(56) References Cited

U.S. PATENT DOCUMENTS

| | | |
|---|---|---|
| 7,808,527 B2 | 10/2010 | Kuroki |
| 8,237,824 B1 | 8/2012 | Linzer |
| 8,803,976 B2 | 8/2014 | Kabasawa |
| 8,825,306 B2 | 9/2014 | Dankers |
| 9,389,693 B2 | 7/2016 | Lee |
| 9,986,170 B2 | 5/2018 | Shin |
| 10,244,150 B2* | 3/2019 | Son ................ H04N 23/663 |
| 10,337,914 B2* | 7/2019 | Kim ................ G06F 1/3231 |
| 10,466,779 B1 | 11/2019 | Liu |
| 10,958,885 B2* | 3/2021 | Gutierrez ........... H04N 9/646 |
| 2005/0093982 A1 | 5/2005 | Kuroki |
| 2008/0303920 A1 | 12/2008 | Kinoshita |
| 2011/0181731 A1 | 7/2011 | Kabasawa |
| 2013/0085642 A1 | 4/2013 | Dankers |
| 2013/0229550 A1 | 9/2013 | Nakao |
| 2014/0320403 A1 | 10/2014 | Lee |
| 2014/0320706 A1 | 10/2014 | Shin |
| 2016/0080670 A1 | 3/2016 | Rangan |
| 2016/0094800 A1 | 3/2016 | Gousev |
| 2016/0187196 A1* | 6/2016 | Kim .................... G01J 1/44 |
| | | 250/206.1 |
| 2016/0198102 A1 | 7/2016 | Chahine |
| 2016/0274643 A1 | 9/2016 | Liu |
| 2017/0155805 A1 | 6/2017 | Son |
| 2017/0215766 A1* | 8/2017 | Fernandez Prada . A61B 5/0082 |
| 2017/0302867 A1 | 10/2017 | Ichikawa |
| 2017/0330332 A1* | 11/2017 | Choi ................ H04N 23/698 |
| 2017/0339321 A1 | 11/2017 | Leonelli, Jr. |
| 2018/0058926 A1* | 3/2018 | Suh .................. H03F 3/45071 |
| 2018/0063442 A1 | 3/2018 | Mäkelä |
| 2018/0146149 A1 | 5/2018 | Suh |
| 2018/0233104 A1* | 8/2018 | Lee .................. G09G 5/026 |
| 2018/0255280 A1* | 9/2018 | Gutierrez ............ G01S 17/32 |
| 2018/0262705 A1* | 9/2018 | Park ................. H04N 25/79 |
| 2018/0302562 A1 | 10/2018 | Newcombe |
| 2018/0359452 A1* | 12/2018 | Chae ................ H04N 23/695 |
| 2019/0052820 A1 | 2/2019 | Berner |
| 2019/0279379 A1 | 9/2019 | Srinivasan |
| 2019/0364230 A1 | 11/2019 | Yeo |

FOREIGN PATENT DOCUMENTS

| | | |
|---|---|---|
| JP | 7226873 A | 8/1995 |
| JP | 11220661 A | 8/1999 |
| JP | 2005136868 A | 5/2005 |
| JP | 2009130725 A | 6/2009 |
| JP | 2009139724 A | 6/2009 |
| JP | 2009210784 A | 9/2009 |
| JP | 2010134480 A | 6/2010 |
| JP | 2011176793 A | 9/2011 |
| JP | 2013079937 A | 5/2013 |
| JP | 2014535098 A | 12/2014 |
| JP | 2017533497 A | 11/2017 |
| JP | 2018501675 A | 1/2018 |
| JP | 2018085725 A | 5/2018 |
| WO | 2016053764 A1 | 4/2016 |

OTHER PUBLICATIONS

International Search Report for corresponding PCT Application No. PCT/JP2019/038114, 4 pages, dated Nov. 5, 2019.
International Preliminary Report on Patentability and Written Opinion for related PCT Application No. PCT/JP2019/038116, 13 pages, dated Apr. 15, 2021.
International Preliminary Report on Patentability and Written Opinion for corresponding PCT Application No. PCT/JP2019/038114, 16 pages, dated Apr. 15, 2021.
International Preliminary Report on Patentability and Written Opinion for related PCT Application No. PCT/JP2019/038115, 16 pages, dated Apr. 15, 2021.
Decision of Refusal for corresponding JP Application No. 2018-188934, 9 pages, dated Jan. 13, 2023.
International Search Report for corresponding PCT Application No. PCT/JP2019/038116, 4 pages, dated Nov. 5, 2019.
International Search Report for corresponding PCT Application No. PCT/JP2019/038115, 4 pages, dated Dec. 24, 2019.
Office Action for corresponding JP Patent application No. 2018-188934, 10 pages, dated Jul. 29, 2022.
The First Office Action for corresponding CN Application No. 201980063445.5, 16 pages, dated Dec. 5, 2023.
Office Action for related Chinese Patent application No. 201980063544. 3, 16 pages, dated May 25, 2022.

* cited by examiner

SENSOR MODULE, ELECTRONIC DEVICE, SUBJECT DETECTION METHOD, AND PROGRAM

TECHNICAL FIELD

The present invention relates to a sensor module, an electronic device, a subject detection method, and a program.

BACKGROUND ART

An event-driven vision sensor is known in which pixels that detect a change in the intensity of incident light generate signals asynchronously in time. The event-driven vision sensor is advantageous in that the sensor can operate at low power and high speed compared to a frame-type vision sensor that scans all pixels at predetermined cycles, specifically, an image sensor such as a charge-coupled device (CCD) or a complementary metal oxide semiconductor (CMOS). Techniques regarding such an event-driven vision sensor are described in PTL 1 and PTL 2, for example.

CITATION LIST

Patent Literature

[PTL 1] JP-T-2014-535098 [PTL 2] JP 2018-85725 A

SUMMARY

Technical Problem

However, although the above-mentioned advantages are known regarding the event-driven vision sensor, it is hard to say that peripheral technologies in which characteristics different from those of the conventional vision sensor such as the frame-type vision sensor are considered have been sufficiently proposed.

Therefore, an object of the present invention is to provide a sensor module, an electronic device, a subject detection method, and a program that enable an event to be generated at a given timing in an event-driven vision sensor.

Solution to Problem

According to an aspect of the invention, provided are a sensor module including an event-driven vision sensor that includes a sensor array having a sensor that generates an event signal when the sensor detects a change in intensity of incident light, and an actuator connected to the sensor array and configured to displace the sensor array in a predetermined direction, and an electronic device having such a sensor module.

According to another aspect of the invention, provided is a subject detection method using an event-driven vision sensor that includes a sensor array having a sensor that generates an event signal when the sensor detects a change in the intensity of incident light, and the method includes steps of driving an actuator connected to the sensor array to displace the sensor array in a predetermined direction and detecting a subject from the event signal generated after the sensor array is displaced.

According to yet another aspect of the present invention, provided is a program that causes a processing circuit connected to an event-driven vision sensor that includes a sensor array having a sensor that generates an event signal when the sensor detects a change in the intensity of incident light to perform steps of driving an actuator connected to the sensor array to displace the sensor array in a predetermined direction and detecting a subject from the event signal generated after the sensor array is displaced.

According to the above configuration, the actuator can displace the sensor array to generate an event at a given timing in the event-driven vision sensor.

DESCRIPTION OF EMBODIMENTS

Hereinafter, some embodiments of the present invention will be described in detail with reference to the accompanying drawings. Incidentally in the present specification and the drawings, components having substantially the same functional configuration are designated by the same reference numerals, so that duplicate description will be omitted.

First Embodiment

Figure 1:
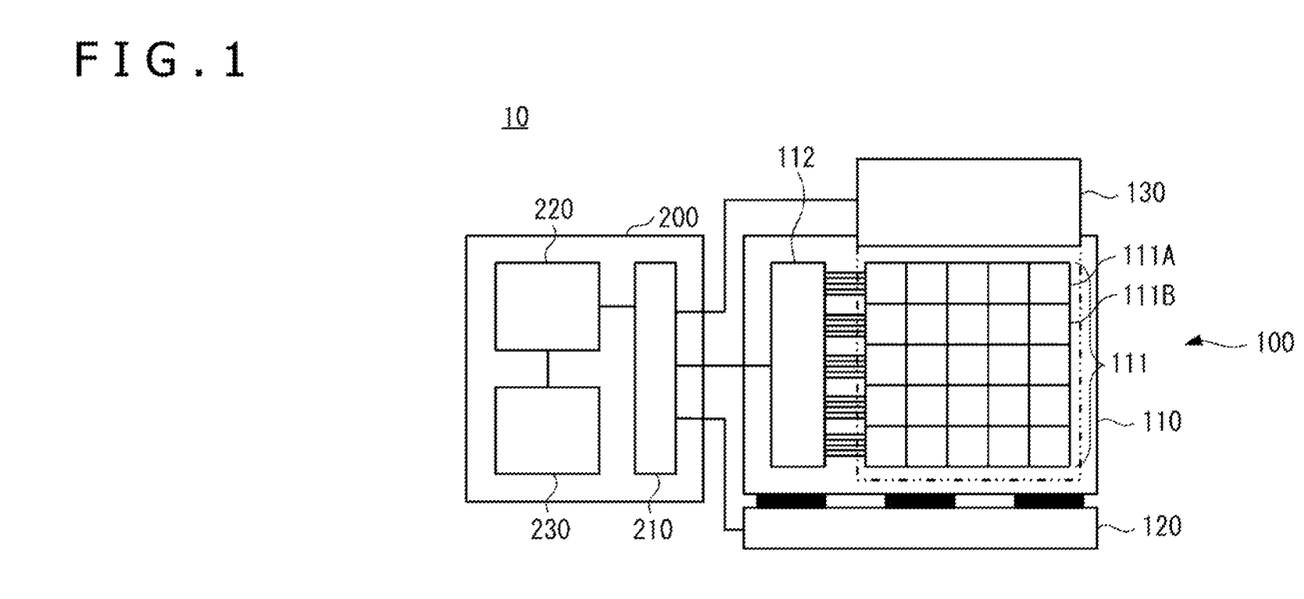
FIG. 1 is a block diagram illustrating a schematic configuration of an electronic device including a sensor module according to a first embodiment of the present invention.

FIG. 1 is a block diagram illustrating a schematic configuration of an electronic device including a sensor module according to the first embodiment of the present invention. As illustrated in FIG. 1, an electronic device 10 includes a sensor module 100 and a control unit 200.

The sensor module 100 includes an event-driven vision sensor 110, an actuator 120, and a shutter 130. The vision sensor 110 includes a sensor array 111 having sensors 111A, 111B, . . . corresponding to pixels of an image, and a processing circuit 112 connected to the sensor array 111. The sensors 111A, 111B, . . . include light receiving elements, and generate event signals when detecting the intensity change of incident light, more specifically, a brightness change. The event signal is output from the processing circuit 112 as a time stamp, sensor identification information (a pixel position, for example), and information indicating polarity of brightness change (increasing or decreasing), for example. When the subject moves within the angle of view of the sensor array 111, since the intensity of the light reflected or scattered by the subject changes, the movement of the subject can be detected in chronological order due to the event signal generated by the sensors 111A, 111B, ... corresponding to the edge of the subject, for example.

Here, as already described, the event-driven vision sensor 110 is advantageous in that the sensor can operate at high speed with low power consumption as compared with the frame type vision sensor. This is because only the sensors that detect the change in brightness generate event signals, among the sensors 111A, 111B, ... that constitute the sensor array 111. Since the sensor that does not detect the brightness change does not generate an event signal, the processing circuit 112 can process and transmit at high speed only the event signal of the sensor that has detected the brightness change. Further, in the case where there is no change in brightness, processing and a transmission process do not occur, so that operation with low power becomes possible. On the other hand, even if the subject exists within the angle of view of the sensor array 111, the brightness does not change unless the subject moves, and thus it is difficult to capture the subject which is not moving, by using the event signals generated by the sensors 111A, 111B, . . . . That is, it is difficult to obtain information regarding the surrounding environment including a stationary subject only with the vision sensor 110.

In the present embodiment, the sensor module 100 includes the actuator 120 connected to the vision sensor 110. The actuator 120 is driven in accordance with a control signal transmitted from the control unit 200, and is configured to displace the sensor array 111 in a direction perpendicular to the optical axis direction of the sensors 111A, 111B, ..., for example. When the actuator 120 displaces the sensor array 111, the positional relationships among all the sensors 111A, 111B, ... and the subject change. That is, at this time, the same change as when all the subjects have moved within the angle of view of the sensor array 111 occurs. Accordingly, regardless of whether or not the subject is actually moving, the subject can be detected by the event signal generated by the sensors 111A, 111B, ... corresponding to the edge of the subject, for example. Since the amount of displacement of the sensor array 111 required to generate the above change is not large, the actuator 120 may be a device such as a vibrator that slightly displaces or vibrates the sensor array 111.

Note that in the above description, an example in which the direction in which the actuator 120 displaces the sensor array 111 is perpendicular to the optical axis direction of the sensors 111A, 111B, ... has been described, but in the case where the displacement direction is not perpendicular to the optical axis direction, that is, for example, even if the displacement direction is parallel to the direction of the optical axis, the positional relationships among all the sensors 111A, 111B, ... and the subject change. Therefore, the actuator 120 may displace the sensor array 111 in a given direction. Note that in the configuration in which the displacement direction is perpendicular to or nearly perpendicular to the optical axis direction, it is advantageous in that the displacement amount of the sensor array 111 required to generate the above change is minimized, and the positional relationship with the subject changes in a substantially uniform manner throughout the sensors 111A, 111B, . . . .

Further, in the present embodiment, the sensor module 100 includes the shutter 130. The shutter 130 is arranged such that the entire angle of view of the sensor array 111 of the vision sensor 110 can be shielded and opened. The shutter 130 may be a mechanical shutter such as a focal plane shutter or a lens shutter, or an electronic shutter such as a liquid crystal shutter. When the shutter 130 that has been open is closed, the entire angle of view of the sensor array 111 is shielded, so that the intensity of light incident on all the sensors 111A, 111B, ... becomes minimal and constant in principle. Further, when the shutter 130 that has been closed is opened, the entire angle of view of the sensor array 111 is opened, which causes a change to raise brightness in all the sensors 111A, 111B, ... in principle. As will be described later, in the present embodiment, such an operation is used to calibrate the sensor array 111 and detect a self-luminous subject.

The control unit 200 includes a communication interface 210, a processing circuit 220, and a memory 230. The communication interface 210 receives an event signal transmitted from the processing circuit 112 of the vision sensor 110 and outputs the event signal to the processing circuit 220. Further, the communication interface 210 transmits the control signal generated by the processing circuit 220 to the actuator 120. The processing circuit 220 operates in accordance with a program stored in the memory 230, for example, and processes the received event signal. For example, the processing circuit 220 generates images that map the positions where the brightness change occurs in chronological order on the basis of the event signal, and temporarily or continuously stores the image in the memory 230, or further sends the image to another device via the communication interface 210. Further, the processing circuit 220 generates respective control signals for driving the actuator 120 and the shutter 130.

Figure 2:
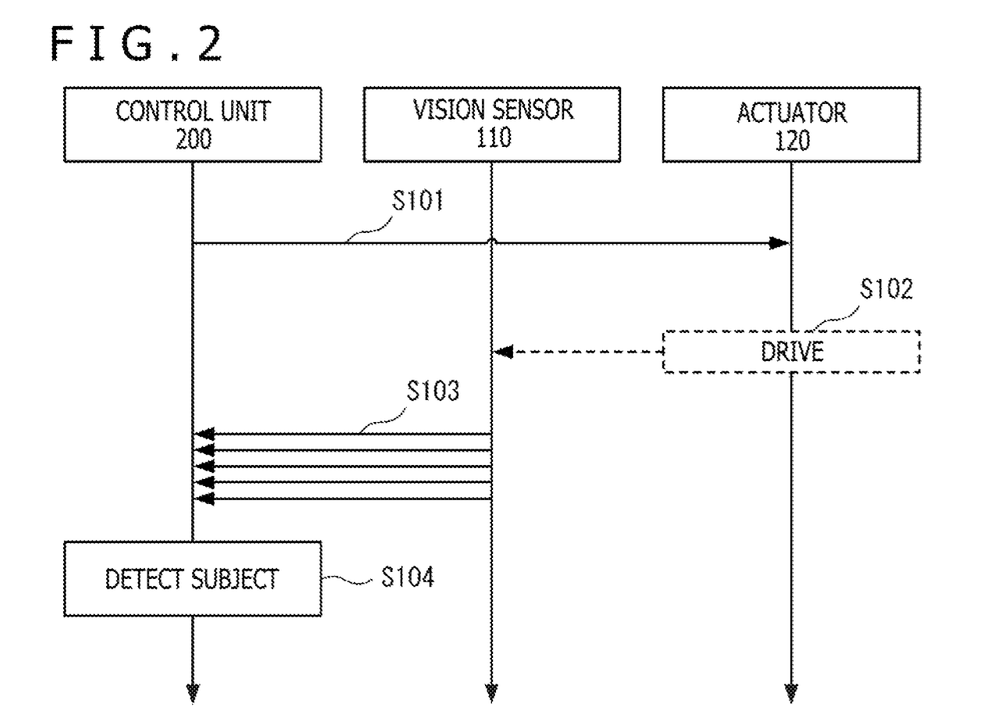
FIG. 2 is a sequence diagram illustrating a first example of the operation of the sensor module according to the first embodiment of the present invention.

FIG. 2 is a sequence diagram illustrating a first example of the operation of the sensor module according to the first embodiment of the present invention. In the illustrated example, first, the control signal generated by the processing circuit 220 of the control unit 200 is transmitted to the actuator 120 (S101). When the actuator 120 that has received the control signal is driven (S102), the sensor array 111 is displaced in a predetermined direction, and the event signals generated by the sensors 111A, 111B, ... corresponding to the edges of all the subjects in principle are transmitted from the vision sensor 110 to the control unit 200 (S103). The processing circuit 220 detects a subject from the received event signal (S104). As described above, at this time, the subject can be detected regardless of whether or not the subject is actually moving. The processing circuit 220 may execute procedures from transmission of the control signal to the actuator 120 (S101) to reception of the event signal (S103) and capture of environmental information based on the event signal (S104) as a series of procedures. For example, the processing circuit 220 may treat an event signal received during a predetermined time period from the transmission of the control signal to the actuator 120 (S101), separately from an event signal received at a time, as an event signal indicating environmental information.

Figure 3:
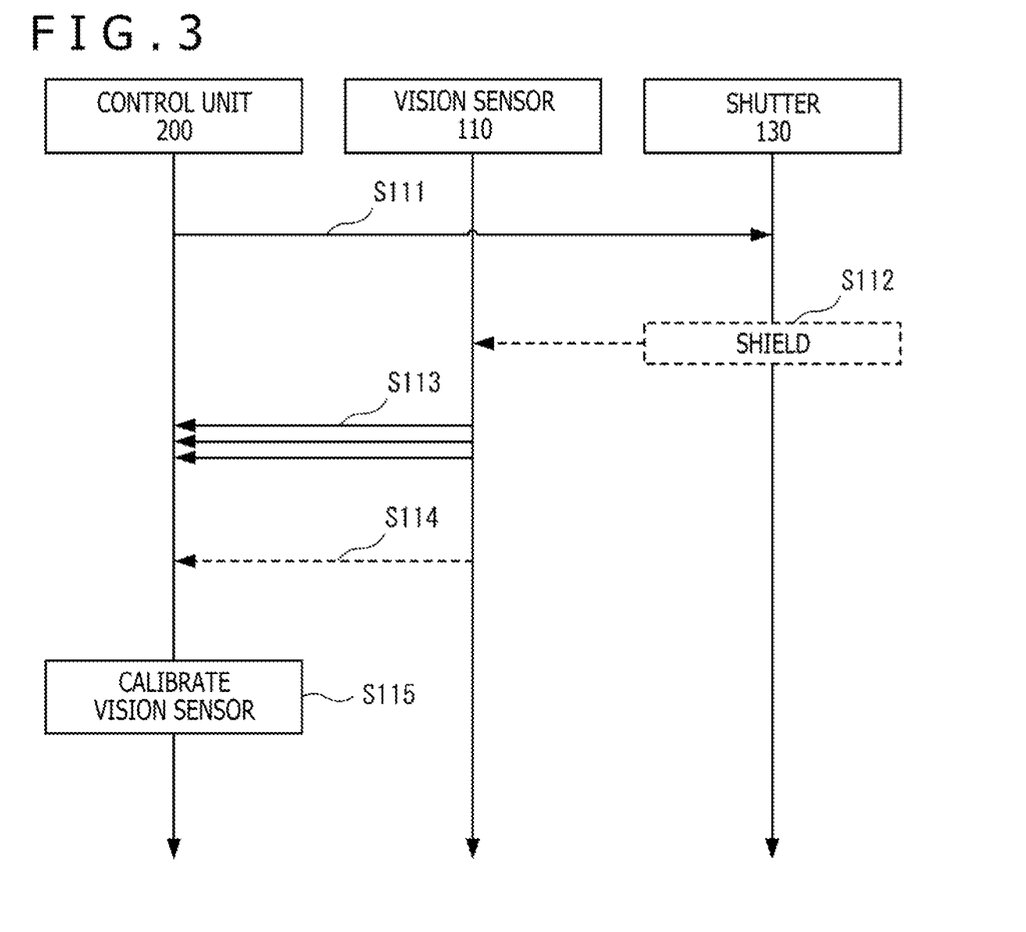
FIG. 3 is a sequence diagram illustrating a second example of the operation of the sensor module according to the first embodiment of the present invention.

FIG. 3 is a sequence diagram illustrating a second example of the operation of the sensor module according to the first embodiment of the present invention. In the illustrated example, first, in the state where the shutter 130 is open, the control signal generated by the processing circuit 220 of the control unit 200 is transmitted to the shutter 130 (S111). By closing the shutter 130 that has received the control signal (S112), the entire angle of view of the sensor array 111 is shielded, and the intensity of light incident on all the sensors 111A, 111B, ... becomes minimal and constant. Accordingly, the event signals should not be received in principle, after the event signals indicating that the brightness has decreased due to the light being blocked are transmitted from the vision sensor 110 to the control unit 200 (S113). However, in the case where the sensor is defective or noise is detected as a brightness change due to improper setting of the threshold value of the brightness change for generating an event signal in the sensor, for example, an event signal can be generated while the shutter 130 is shielding the angle of view of the sensor array 111. Therefore, in the control unit 200, the processing circuit 220 maintains the shutter 130 to be closed for a predetermined time period, and monitors the event signal received while the shutter 130 is shielding the angle of view of the sensor array 111. In the case where an event signal is received during this period (S114), the processing circuit 220 calibrates the vision sensor 110 on the basis of the received event signal (S115). To be specific, the processing circuit 220 identifies the sensor having generated the event signal, as a defective pixel (luminescent spot), or adjusts the threshold value of the brightness change for generating the event signal in the sensor.

Figure 4:
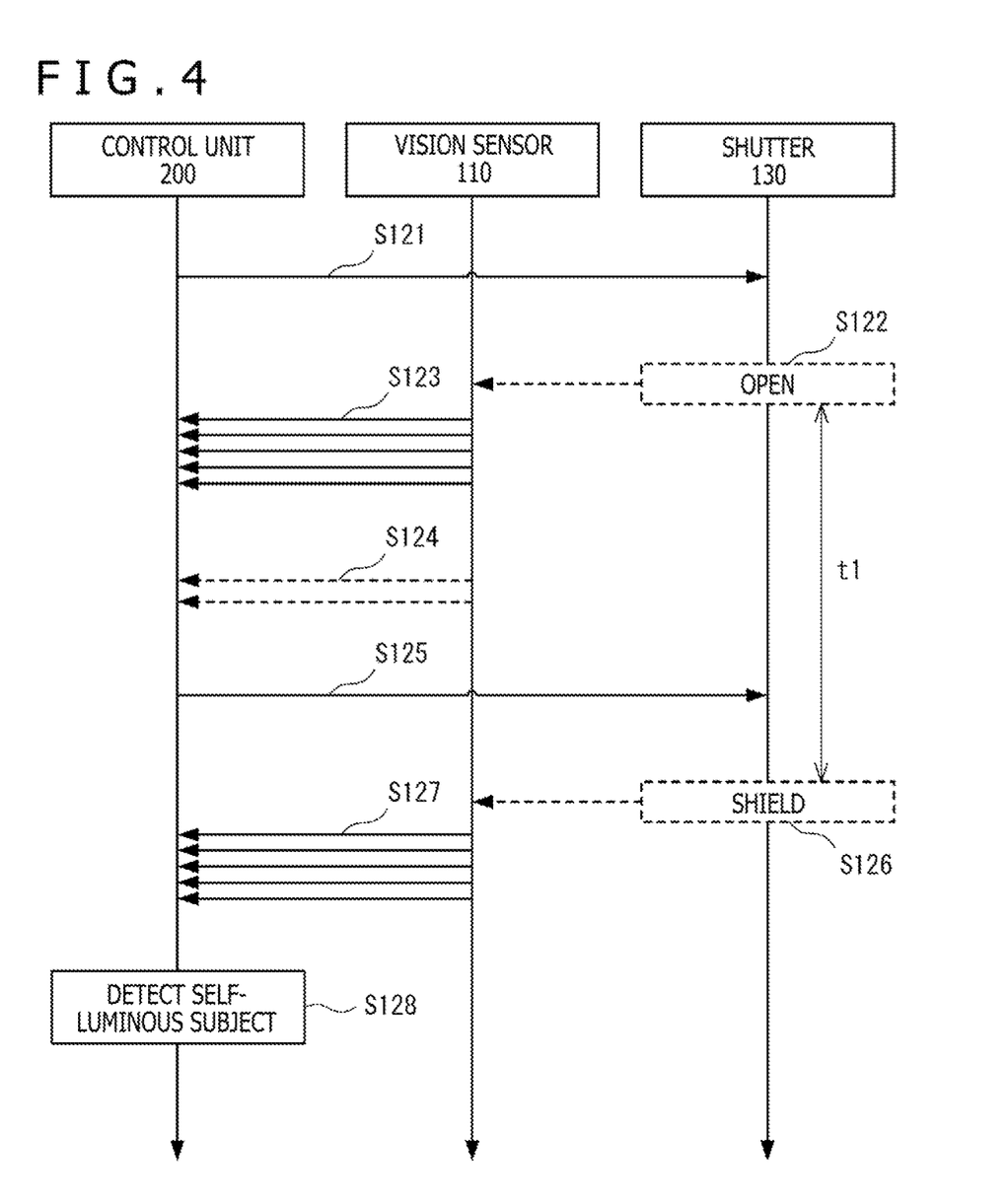
FIG. 4 is a sequence diagram illustrating a third example of the operation of the sensor module according to the first embodiment of the present invention.

FIG. 4 is a sequence diagram illustrating a third example of the operation of the sensor module according to the first embodiment of the present invention. In the illustrated example, first, in the state where the shutter 130 is closed, the control signal generated by the processing circuit 220 of the control unit 200 is transmitted to the shutter 130 (S121). When the shutter 130 that has received the control signal is opened (S122), the entire angle of view of the sensor array 111 is opened, and event signals indicating that the brightness has increased in all the sensors 111A, 111B, . . . in principle are transmitted from the vision sensor 110 to the control unit 200 (S123). After that, the control signal generated by the processing circuit 220 of the control unit 200 is transmitted to the shutter 130 again (S125), and when the shutter 130 is closed (S126), so that the entire angle of view of the sensor array 111 is shielded, event signals indicating that the brightness has decreased in all the sensors 111A, 111B, . . . are transmitted from the vision sensor 110 to the control unit 200 (S127). In this way, the control unit 200 transmits a control signal for repeating the shielding and opening of the angle of view of the sensor array 111 to the shutter 130, and receives the event signal generated by the vision sensor 110 meanwhile, particularly during the period from the opening to the shielding of the angle of view.

Here, if the time period t1 from the opening (S122) to the shielding (S126) of the angle of view by the shutter 130 is short (specifically, 300 msec or less, for example), the subject hardly moves, and therefore the event signal indicating that the subject moves should not be received. As an exception, in the case where the blinking cycle of the light source in a self-luminous subject such as an illumination or a display is shorter than the time period t1, an event signal indicating the blinking of these subjects is received (S124). Accordingly, by making the time period t1, namely, the cycle of repeating the shielding and opening of the angle of view longer than the blinking cycle of the light source included in the self-luminous subject (while keeping the time period t1 short as described above), the control unit 200 can identify the self-luminous subject on the basis of the received event signal (S128).

In the first embodiment of the present invention as described above, due to the actuator 120 displacing the sensor array 111, an event is forcibly generated in the vision sensor 110, and information regarding the surrounding environment including a stationary subject, for example, can be obtained. Further, in the present embodiment, the sensor array 111 can be calibrated due to the shutter 130 shielding the entire angle of view of the sensor array 111. Still further, by repeating the opening and closing of the shutter 130 at a predetermined cycle, a self-luminous subject such as an illumination or a display can be detected.

Note that in the above example, the sensor module 100 includes both the actuator 120 and the shutter 130, but since these functions are independent of each other, either the actuator 120 or the shutter 130 may be included in the sensor module 100. Further, although the control unit 200 is illustrated and described separately from the sensor module 100 in the above example, the control unit 200 may be included in the sensor module 100. In this case, the processing circuit 112 of the sensor module 100 and the processing circuit 220 of the control unit 200 may be configured separately or may be common.

Second Embodiment

Figure 5:
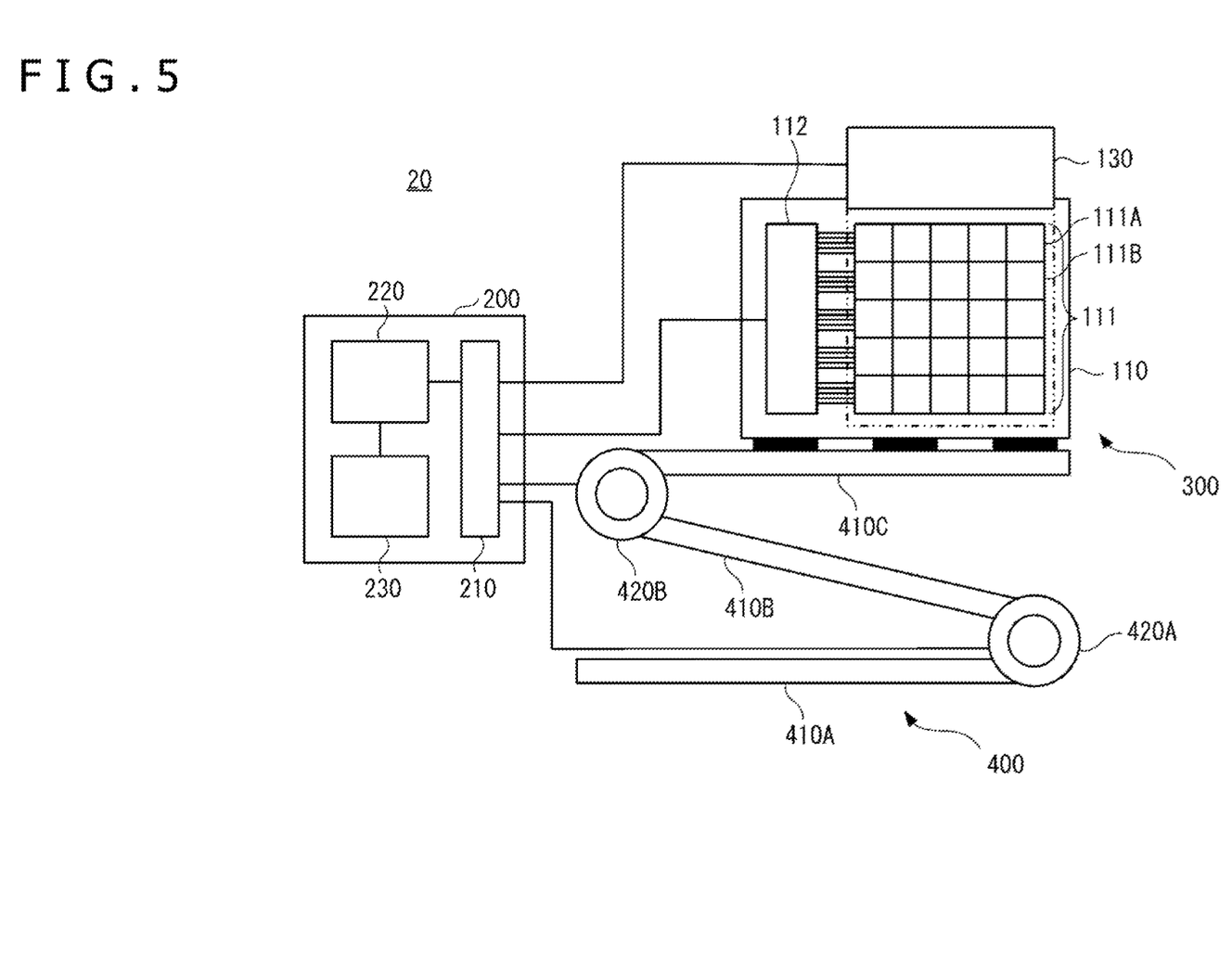
FIG. 5 is a block diagram illustrating a schematic configuration of an electronic device including a sensor module according to a second embodiment of the present invention.

FIG. 5 is a block diagram illustrating a schematic configuration of an electronic device including a sensor module according to a second embodiment of the present invention. As illustrated in FIG. 5, an electronic device 20 includes a sensor module 300, the control unit 200, and a movable support mechanism 400.

The sensor module 300 includes an event-driven vision sensor 110 similar to one in the first embodiment, and the shutter 130. The sensor module 300 is supported by the movable support mechanism 400 including frames 410A, 410B, and 410C and actuators 420A and 420B. In the illustrated example, the actuators 420A and 420B are rotary actuators driven in accordance with a control signal transmitted from the control unit 200. The actuator 420A causes a rotational displacement of a predetermined angle between the frames 410A and 410B in accordance with the control signal, and the actuator 420B similarly causes a rotational displacement of a predetermined angle between the frames 410B and 410C. Thereby, the actuators 420A and 420B displace the sensor module 300 including the vision sensor 110.

Also in the present embodiment, for example, by using the actuator 420B in the same manner as the actuator 120 of the first embodiment to forcibly generate an event in the vision sensor 110, information regarding the surrounding environment including a stationary subject, for example, can be obtained. In this case, for example, the actuator 420B may be understood to be included in the sensor module 300. In addition, in the present embodiment, as in the example described below, the control unit 200 can reflect the correction value in the control signals of actuators 420A and 420B on the basis of the event signal generated by the vision sensor 110 when the actuators 420A and 420B displace the sensor module 300.

Figure 6:
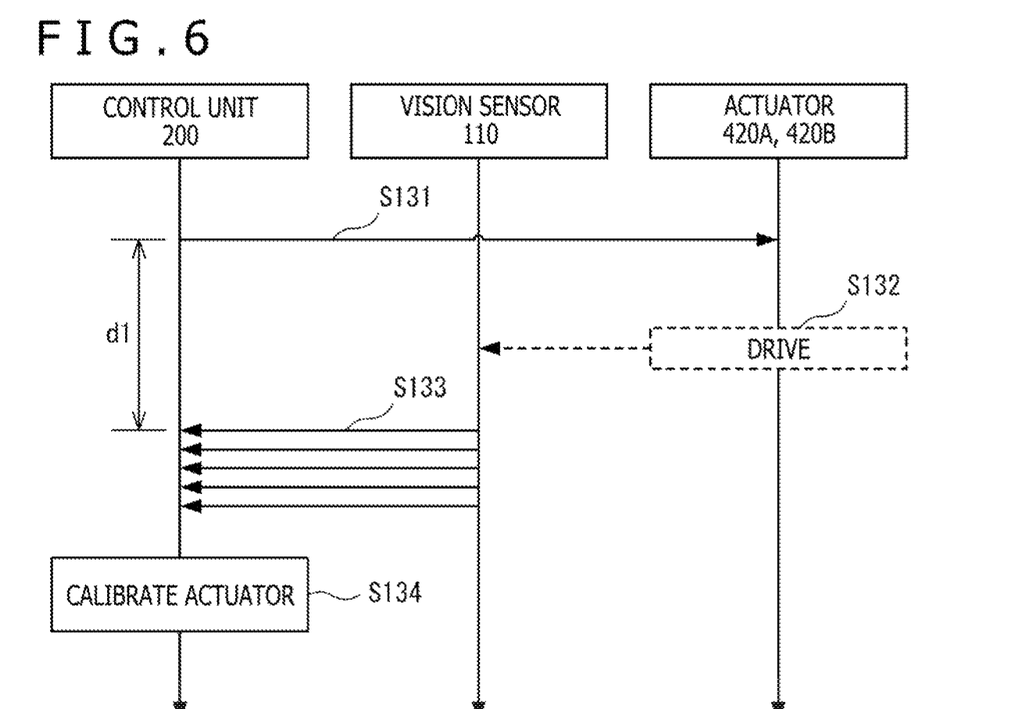
FIG. 6 is a sequence diagram illustrating a first example of the operation of the sensor module according to the second embodiment of the present invention.

FIG. 6 is a sequence diagram illustrating a first example of the operation of the sensor module according to the second embodiment of the present invention. In the illustrated example, first, the control signal generated by the processing circuit 220 of the control unit 200 is transmitted to one or both of the actuators 420A and 420B (S131). When the actuators 420A and 420B are driven in accordance with the control signal (S132), the sensor module 300 is displaced, and the positional relationships among the sensors 111A, 111B, . . . and the subject change. At this time, the event signals generated by the sensors 111A, 111B, . . . are transmitted from the vision sensor 110 to the control unit 200 (S133). In the control unit 200, the processing circuit 220 measures the delay time period d1 from the transmission of the control signal to the actuators 420A and 420B (S131) to the reception of the event signal (S133) and calibrates the actuators 420A and 420B on the basis of the delay time period d1 (S134). To be specific, the processing circuit 220 determines a correction value of the control signal according to the delay time period d1, and the determined correction value is reflected in the control signal subsequently generated by the processing circuit.

In the above example, for example, if the control signal is transmitted to either the actuator 420A or 420B, the actuator 420A or the actuator 420B can be calibrated independently. Further, if the control signal is transmitted to both of the actuators 420A and 420B, the composite system including the actuators 420A and 420B can be calibrated. The correction value of the control signal determined according to the delay time period d1 is used, for example, when the control unit 200 corrects the parameters of the proportional-integral-derivative (PID) control executed in the case where the actuators 420A and 420B are desired to implement the displacement following a specific pattern.

Figure 7:
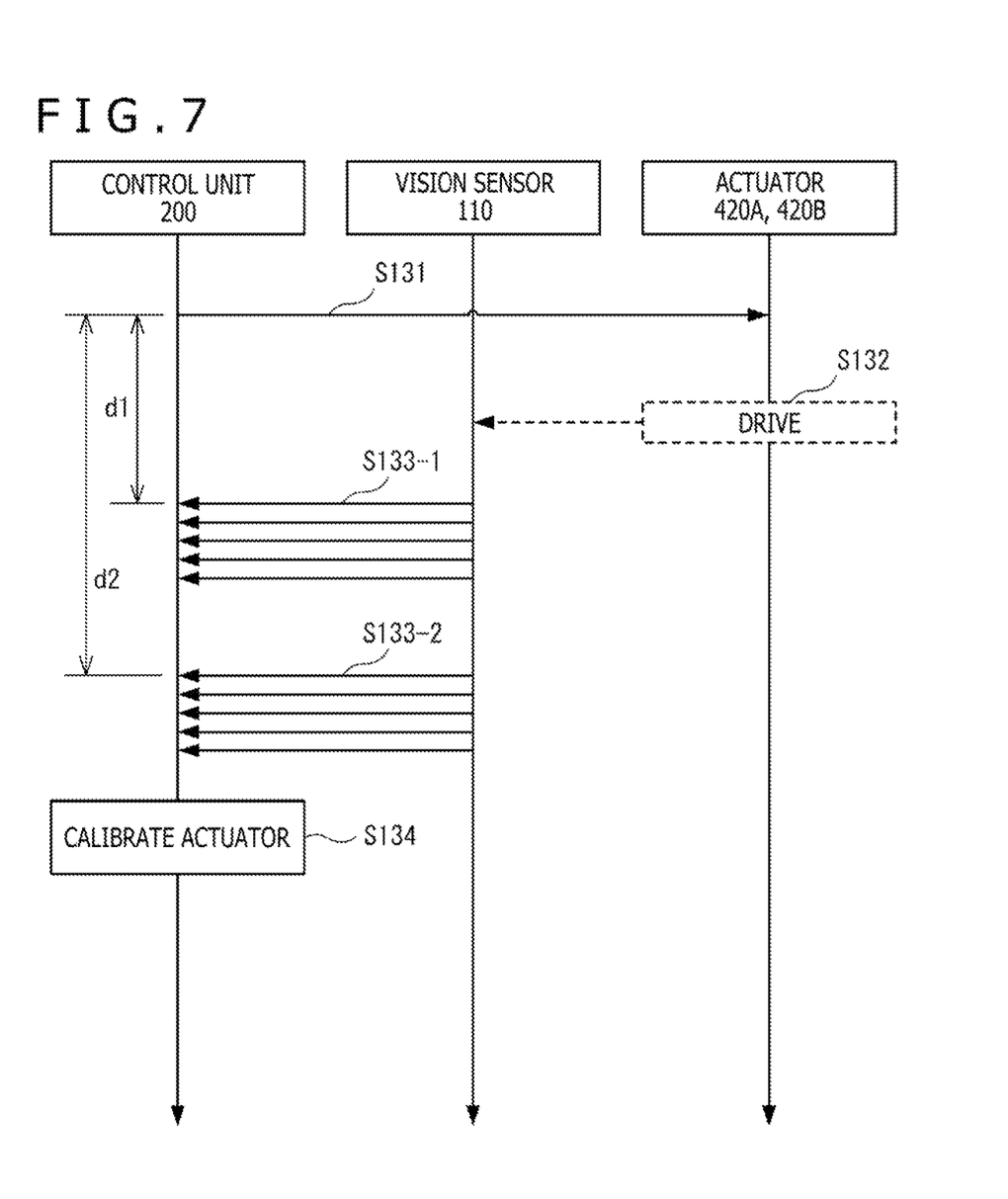
FIG. 7 is a sequence diagram illustrating a second example of the operation of the sensor module according to the second embodiment of the present invention.

FIG. 7 is a sequence diagram illustrating a second example of the operation of the sensor module according to the second embodiment of the present invention. In the illustrated example, similarly to the example illustrated above in FIG. 6, the control signal is transmitted (S131), and the actuators 420A and 420B that have received the control signal drive to cause rotation displacement in the vision sensor 110 (S132). Here, for example, in the case where the actuators 420A and 420B are worn, the rotational displacement of the vision sensor 110 does not become stable instantaneously, and vibration occurs, for example. In this case, the event signals generated by the sensors 111A, 111B, . . . due to change of the positional relationships among the sensors 111A, 111B, . . . and the subject are transmitted from the vision sensor 110 to the control unit 200 at a plurality of timings (S133-1 and S133-2). The processing circuit 220 measures the delay time periods d1 and d2 from the transmission of the control signal to the actuators 420A and 420B (S131) to the reception of the event signals at a plurality of timings (S133-1 and S133-2), respectively. Due to this, as a result, the processing circuit 220 measures the elapsed time period d2−d1 from the start of reception of the event signal (S133-1) to the end of the reception (S133-2). The processing circuit 220 determines a correction value according to the elapsed time period d2−d1, and the determined correction value is reflected in the control signal generated by the processing circuit thereafter. To be specific, the processing circuit 220 sets a flag indicating that the actuators 420A and 420B are worn in the case where the elapsed time period d2−d1 exceeds a threshold value. In this case, the processing circuit 220 may set a value such as an operating torque different from that of the other actuators for the actuators 420A and 420B in which wear has been generated.

Figure 8:
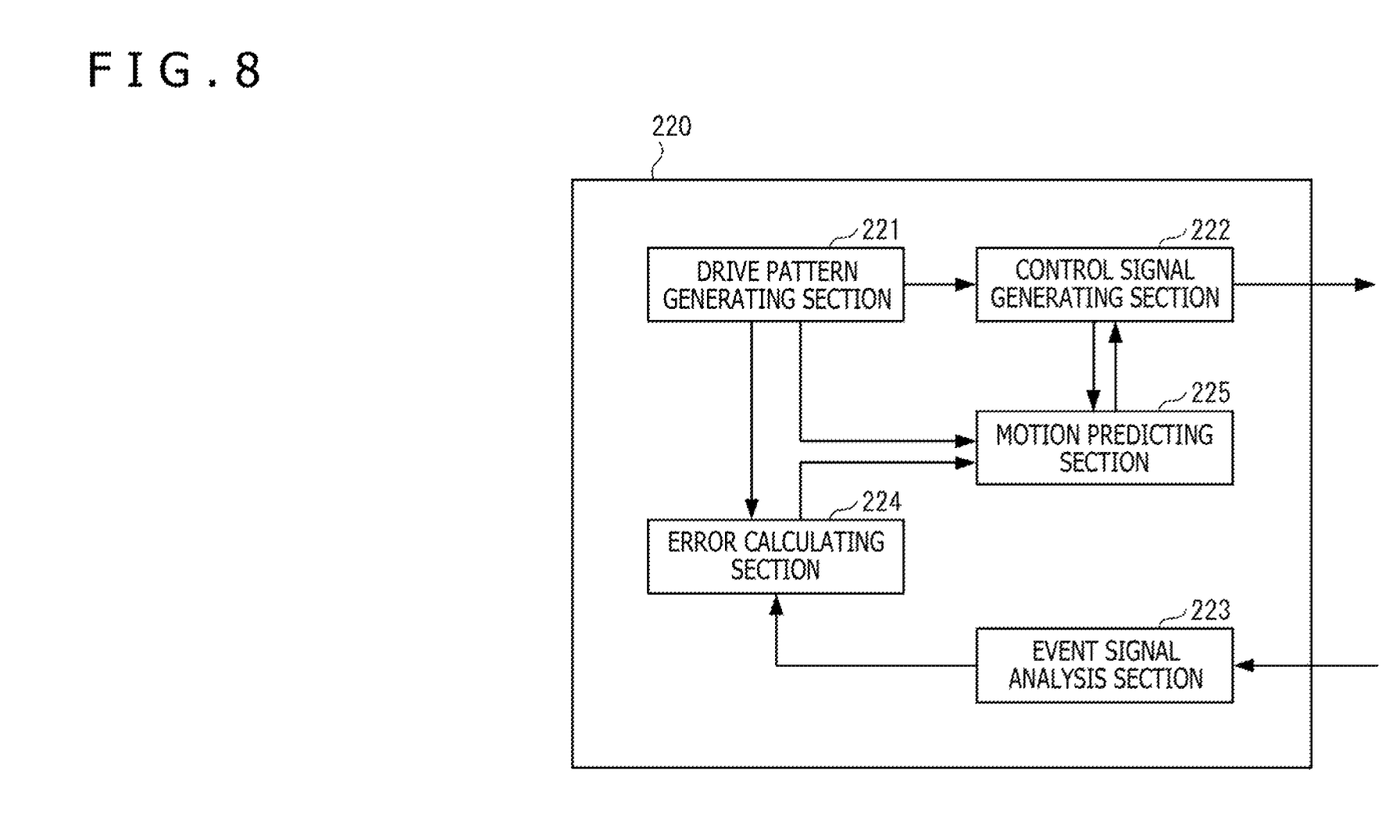
FIG. 8 is a block diagram illustrating a configuration example of a processing circuit of a control unit in the case of executing motion prediction in the second embodiment of the present invention.

FIG. 8 is a block diagram illustrating a configuration example of a processing circuit of a control unit in the case of executing motion prediction in the second embodiment of the present invention. In the illustrated example, the processing circuit 220 of the control unit 200 includes, for example, a drive pattern generating section 221, a control signal generating section 222, an event signal analysis section 223, an error calculating section 224, and a motion predicting section 225, as functions implemented by operation according to a program stored in the memory 230. The drive pattern generating section 221 generates drive patterns for the actuators 420A and 420B. Here, the drive pattern may be predetermined by, for example, a program stored in the memory 230, or is determined on the basis of the measured values of other sensors such as the acceleration sensor included in the electronic device 20. The control signal generating section 222 generates control signals for the actuators 420A and 420B in accordance with the drive pattern generated by the drive pattern generating section 221.

When the actuators 420A and 420B are driven in accordance with the control signal generated by the control signal generating section 222, the event signal is transmitted from the vision sensor 110 to the control unit 200. In the processing circuit 220, the event signal analysis section 223 executes back calculation of the displacement of the sensor module 300 from the received event signal. To be specific, for example, the event signal analysis section 223 executes back calculation of the motion vector of the vision sensor 110 from the motion vector of the subject obtained by analyzing the event signal. The event signal analysis section 223 provides the error calculating section 224 with information including the displacement of the sensor module 300 obtained by back calculation. The error calculating section 224 calculates the error characteristics of the actuators 420A and 420B from the difference between the displacement of the sensor module 300 obtained by back calculation and the drive pattern generated by the drive pattern generating section 221, while taking into consideration the delay time period d1 of the operation of the actuators 420A and 420B specified by the example described above with reference to FIG. 6, for example. The error characteristics may be normalized for each type of movement of the actuators 420A and 420B (specifically, translation and rotation in each axial direction), for example, to be stored in the memory 230.

After that, in the case where the drive pattern generating section 221 generates a new drive pattern for the actuators 420A and 420B, the control signal generating section 222 inputs the generated control signal to the motion predicting section 225 before outputting the control signal. The motion predicting section 225 predicts the motion of the actuators 420A and 420B with respect to the input control signal on the basis of the error characteristics of the actuators 420A and 420B calculated by the error calculating section 224. The control signal generating section 222 corrects the control signal such that the difference between the movement predicted by the motion predicting section 225 and the drive pattern generated by the drive pattern generating section 221 becomes small. Further, the control signal generating section 222 inputs the corrected control signal to the motion predicting section 225 again, and the motion predicting section 225 predicts again the movements of the actuators 420A and 420B with respect to the control signal corrected on the basis of the error characteristics, and then, the control signal generating section 222 may correct the control signal again such that the difference between the motion predicted again and the drive pattern becomes small.

In the second embodiment of the present invention as described above, in addition to the effect of the first embodiment described above, the processing circuit 220 of the control unit 200 can calibrate the delay amount of the actuators 420A and 420B and detect the vibration due to the wear of the internal components of the actuators 420A and 420B by measuring the delay time periods d1 and d2 from transmission of the control signal to the actuators 420A and 420B to the reception of event signals. Further, in the present embodiment, the processing circuit 220 implements the functions of the error calculating section 224 and the motion predicting section 225 to correct the control signal in consideration of the error generated in the motion of the actuators 420A and 420B, and can operate the actuators 420A and 420B more accurately with respect to the intended drive pattern.

Note that in the above example, the calibration of the delay amount of the actuators 420A and 420B, the detection of vibration, and the correction of the control signal have been described in the same embodiment, but since these operations can be performed independently of each other, a part of these may be implemented and the rest may not be implemented in the electronic device 20 or the sensor module 300. Further, in the above example, the vision sensor 110 has been described as being capable of forcibly generating an event similarly to the first embodiment, but this function is not essential. Since the shutter 130 is not essential either, the vision sensor 110 does not have to include the shutter 130 in the present embodiment.

Although some embodiments of the present invention have been described in detail with reference to the accompanying drawings hereinabove, the present invention is not limited to such examples. It is clear that a person having ordinary knowledge in the field of technology to which the present invention belongs can come up with various alteration examples or modification examples within the scope of the technical ideas described in the claims, and it is naturally understood that these also belong to the technical scope of the present invention.

REFERENCE SIGNS LIST

10, 20 . . . Electronic device, 100, 300 . . . Sensor module, 110 . . . Vision sensor, 111 . . . Sensor array, 111A, 111B . . . Sensor, 112 . . . Processing circuit, 120 . . . Actuator, 130 . . . Shutter, 200 . . . Control unit, 210 . . . Communication interface, 220 . . . Processing circuit, 221 . . . Drive pattern generating section, 222 . . . Control signal generating section, 223 . . . Event signal analysis section, 224 . . . Error calculating section, 225 . . . Motion predicting section, 230 . . . Memory, 300 . . . Sensor module, 400 . . . Movable support mechanism, 410A, 410B, 410C . . . Frame, 420A, 420B . . . Actuator

The invention claimed is:

1. A sensor module comprising:
an event-driven vision sensor that includes a sensor array having a sensor that generates an event signal when the sensor detects a change in intensity of incident light;
an actuator connected to the sensor array and configured to displace the sensor array in a predetermined direction in order to cause an appearance of movement by at least one object and to invoke the change in intensity of incident light and the event signal even when the at least one object is stationary; and
a control unit that receives the event signal and detects a subject from the event signal, transmits a control signal for displacing the sensor array in the predetermined direction to the actuator, and detects the subject from the event signal generated after the control signal is transmitted.

2. The sensor module according to claim 1, wherein the predetermined direction is a direction perpendicular to an optical axis direction of the sensor.

3. The sensor module according to claim 1, wherein the actuator is configured to vibrate the sensor array in the predetermined direction.

4. The sensor module according to claim 1, wherein the control unit treats the event signal received within a predetermined time period from transmission of the control signal separately from an event signal received at a time other than the predetermined time period.

5. An electronic device comprising:
a sensor module including an event-driven vision sensor that includes a sensor array having a sensor that generates an event signal when the sensor detects a change in intensity of incident light;
an actuator connected to the sensor array and configured to displace the sensor array in a predetermined direction in order to cause an appearance of movement by at least one object and to invoke the change in intensity of incident light and the event signal even when the at least one object is stationary; and
a control unit that receives the event signal and detects a subject from the event signal, transmits a control signal for displacing the sensor array in the predetermined direction to the actuator, and detects the subject from the event signal generated after the control signal is transmitted.

6. A subject detection method by using an event-driven vision sensor that includes a sensor array having a sensor that generates an event signal when the sensor detects a change in intensity of incident light, the method comprising:
driving an actuator connected to the sensor array to displace the sensor array in a predetermined direction in order to cause an appearance of movement by at least one object and to invoke the change in intensity of incident light and the event signal even when the at least one object is stationary; and
detecting a subject from the event signal, transmitting a control signal for displacing the sensor array in the predetermined direction to the actuator, and detecting a subject from the event signal generated after the sensor array is displaced.

7. A non-transitory, computer readable storage medium containing a computer program, which when executed by a computer, causes a processing circuit connected to an event-driven vision sensor that includes a sensor array having a sensor that generates an event signal when the sensor detects a change in intensity of incident light to carry out actions, comprising:
driving an actuator connected to the sensor array to displace the sensor array in a predetermined direction in order to cause an appearance of movement by at least one object and to invoke the change in intensity of incident light and the event signal even when the at least one object is stationary; and
detecting a subject from the event signal, transmitting a control signal for displacing the sensor array in the predetermined direction to the actuator, and detecting a subject from the event signal generated after the sensor array is displaced.

\* \* \* \* \*